(12) United States Patent
Kamiya et al.

(10) Patent No.: US 6,320,138 B1
(45) Date of Patent: *Nov. 20, 2001

(54) SUBSTRATE WITH CONDUCTOR FORMED OF LOW-RESISTANCE ALUMINUM ALLOY

(75) Inventors: Kenji Kamiya; Junji Shiota, both of Akishima (JP)

(73) Assignee: Casio Computer Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/047,693

(22) Filed: Mar. 25, 1998

(30) Foreign Application Priority Data

Apr. 4, 1997 (JP) .................................. 9-100780

(51) Int. Cl.$^7$ .................................. H01R 23/72
(52) U.S. Cl. .................. 174/261; 174/250; 251/771; 251/773; 438/688
(58) Field of Search .................. 174/250, 261; 257/771, 773; 438/688

(56) References Cited

U.S. PATENT DOCUMENTS

| | | | |
|---|---|---|---|
| 5,243,202 | 9/1993 | Mori et al. | 257/59 |
| 5,293,509 | 3/1994 | Yamakawa et al. | |
| 5,367,179 | 11/1994 | Mori et al. | 257/59 |
| 5,514,909 | 5/1996 | Yamamoto et al. | 257/765 |
| 5,734,177 | * 3/1998 | Sakamoto | 257/773 X |
| 5,903,055 | * 5/1999 | Takayama | 257/771 |

FOREIGN PATENT DOCUMENTS

| | | |
|---|---|---|
| 4-130776 | 5/1992 | (JP) . |
| 7-45555 A | 2/1995 | (JP) . |
| 8-306693 | 11/1996 | (JP) . |

OTHER PUBLICATIONS

Patent Abstracts of Japan, vol. 097, No. 003, Mar. 31, 1997 & JP 08 306693 A (IBM Japan Ltd.) Nov. 22, 1996.
Furuta, M. et al; "17.1:A 2.8–in. Diagonal Low–Temperature–Processed Poly–Si TFT–LCD with a New LDD Structure" Proceedings of the 16th. International Display Research Conference Eurodisplay 96, Birmingham, Oct. 1–3, 1996, No. Conf. 16, Oct. 1, 1996, Society for Information Display, pp. 547–550.
*English language Abstract only.

* cited by examiner

*Primary Examiner*—Albert W. Paladini
(74) *Attorney, Agent, or Firm*—Frishauf, Holtz, Goodman, Langer & Chick, P.C.

(57) ABSTRACT

A wiring substrate is disclosed, which has optimal characteristics for, for example, an active matrix type liquid crystal display device with a thin film transistor. Wiring formed of an Al-Nd-Ti alloy thin film is formed on a glass substrate, and if necessary, a semiconductor element which is electrically connected to the wiring is formed. In this case, the specific resistance of the Al-Nd-Ti alloy thin film is about 8 $\mu\Omega$ cm if the Nd concentration is 0.75 at % and the Ti concentration is 0.5 at %. Further, even if the resultant substrate is heated at 240–270 C. after the formation of the wiring, occurrence of a hillock and a pinhole is substantially completely suppressed.

16 Claims, 11 Drawing Sheets

SUBSTRATE WITH CONDUCTOR FORMED OF LOW-RESISTANCE ALUMINUM ALLOY

BACKGROUND OF THE INVENTION

This invention relates to a substrate which has wiring electrically connected to a semiconductor element and showing excellent characteristics, and in particular to a substrate with wiring which has an excellent anti-hillock characteristic, an excellent anti-pinhole characteristic and a low resistance, and is suitable for use in, for example, an active matrix type liquid crystal display device.

Figure 10:
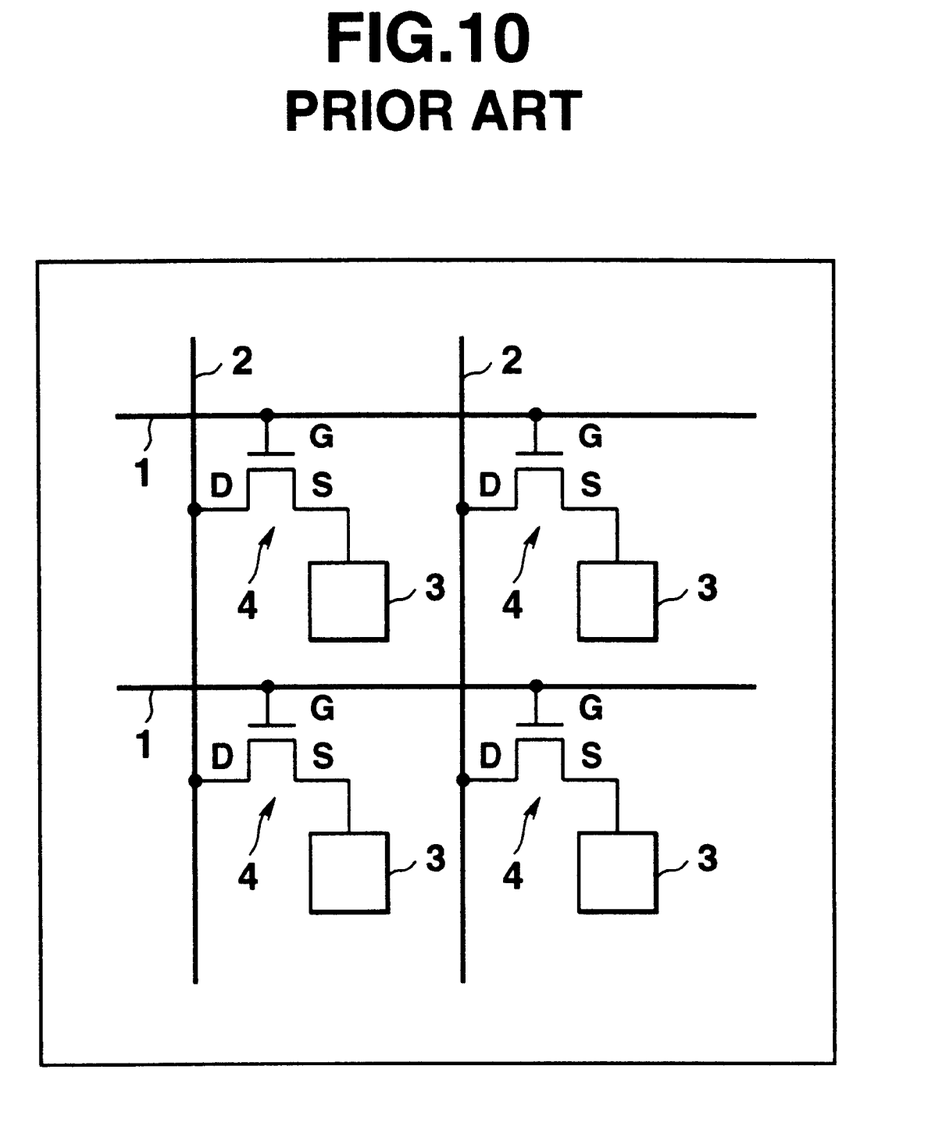
FIG. 10 is a circuit diagram, showing part of the conventional liquid crystal display device.

There is an active matrix type liquid crystal display device which has, for example, wiring including a scanning line 1 and a data line 2, etc., a pixel electrode 3, and a thin film transistor 4 as a switching element located in the vicinity of each intersection of the scanning line 1 and the data line 2, as is shown in FIG. 10. The thin film transistor 4 has a gate electrode G connected to the scanning line 1, a drain electrode D connected to the data line 2, and a source electrode S connected to the pixel electrode 3.

Figure 11:
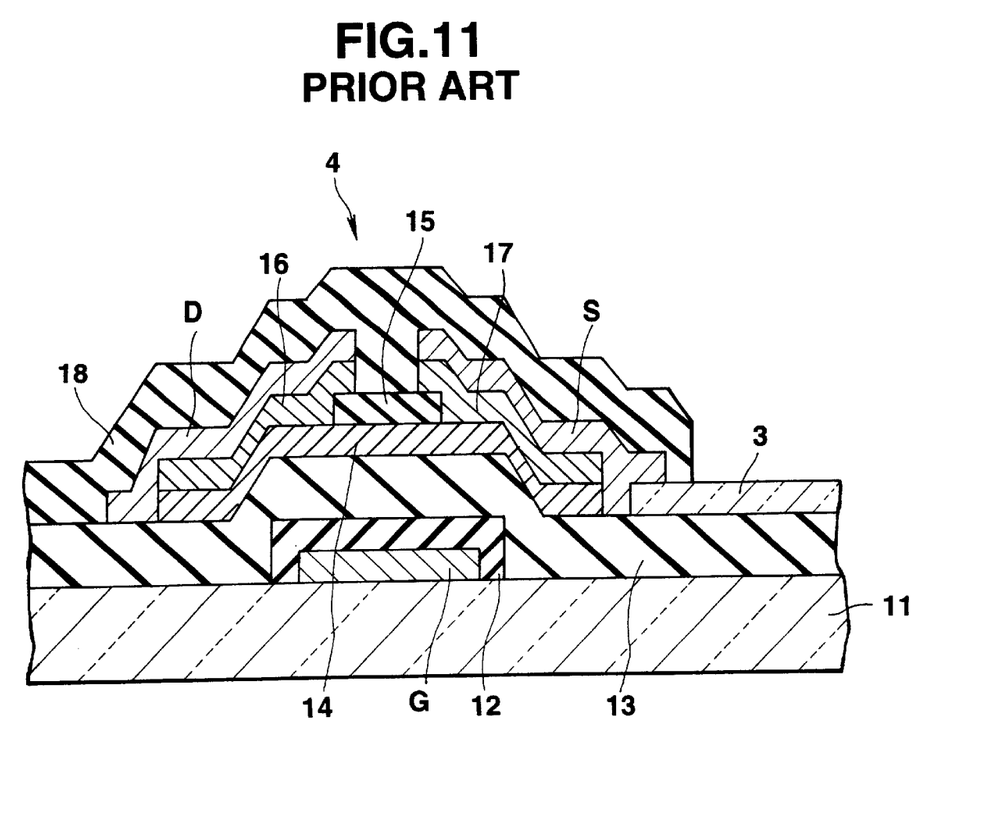
FIG. 11 is an enlarged sectional view, showing, in detail, a thin film transistor which appears in FIG. 10.

FIG. 11 shows a cross section of part of the thin film transistor 4 of FIG. 10. The scanning line 1 including the gate electrode G (see FIG. 10) is formed on a predetermined portion of a glass substrate 11, an anode oxide film 12 is formed on the surface of the scanning line 1, and a gate insulating film 13 is formed on the overall surfaces of the lines and the substrate. A semiconductor thin film 14 made of amorphous silicon is formed on that portion of the gate insulating film 13 which corresponds to the gate electrode G. A blocking layer 15 is formed on a center portion of the semiconductor thin film 14. Ohmic contact layers 16 and 17 made of n$^+$-conductivity silicon are formed on upper opposite side portions of the semiconductor thin film 14 and the blocking layer 15. The drain electrode D and the source electrode S are formed on the ohmic contact layers 16 and 17, respectively. These electrodes D and S and the data line 2 may be formed simultaneously. The pixel electrode 3 is formed on a predetermined upper portion of the gate insulating film 13 such that it is connected to the source electrode S. A passivation film 18 is formed on the overall upper surface of the resultant structure, except for on the surface of the predetermined portion of the pixel electrode 3.

It is known that an Al (Aluminum) alloy which contains a high-melting-point metal such as Ti (Titanium) is used as the material of the wiring forming the scanning line 1 with the gate electrode G (see, for example, Jpn. Pat. Appln. KOKAI Publication No. 4-130776). In this case, the high-melting-point metal Ti is contained in Al in order to suppress the occurrence of hillocks, which may well be formed during a heating treatment performed later since Al itself does not have a sufficient thermal resistance. The anti-hillock characteristic is considered to, for example, reduce the breakdown voltage of the gate insulating film 13 on the scanning line 1 including the gate electrode G. If the Ti concentration of the Al—Ti alloy thin film is reduced to lower its specific resistance, occurrence of any hillock and pinhole cannot be suppressed. If, on the other hand, the concentration of Ti is increased, the above drawback can be countered but the specific resistance of the alloy thin film increases. This alloy thin film is not preferable as an electrode or wiring.

BRIEF SUMMARY OF THE INVENTION

It is the object of the invention to provide a wiring substrate with a conductor which can reduce the specific resistance of the substrate to a value equal to or less than the case of using the Al—Ti alloy thin film, and also can suppress the occurrence of hillocks or pinholes.

The inventors of the present invention made various experiments to test the Al—Ti alloy thin film in detail. The experiment's results and our opinion thereon will now be described.

Figure 5:
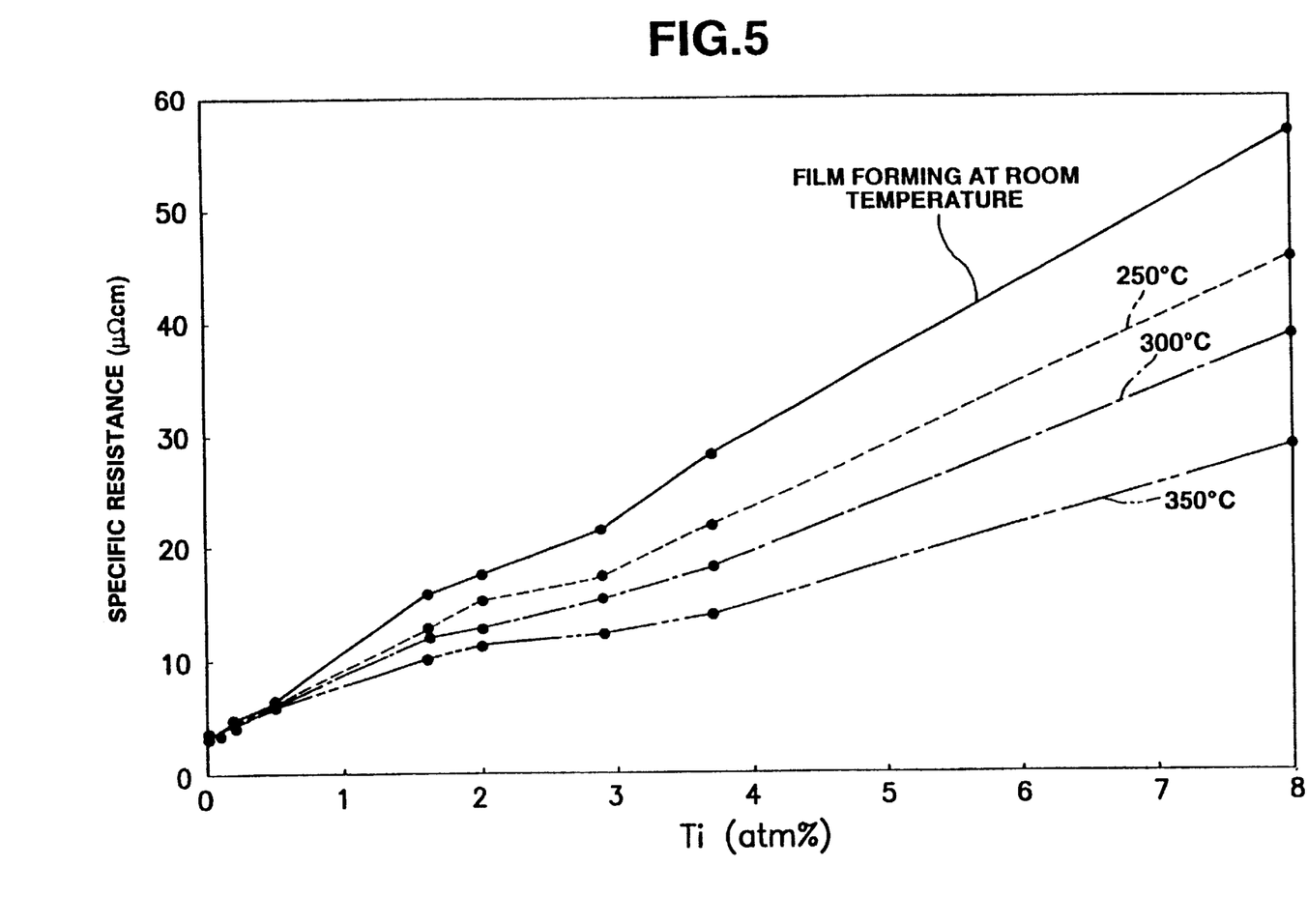
FIG. 5 is a view, showing the dependency of the specific resistance of an Al—Ti alloy thin film upon the concentration of Ti.

First, the dependency of the specific resistance of the Al—Ti alloy thin film upon the concentration of Ti was tested, and test results as shown in FIG. 5 were obtained. In FIG. 5, the ordinate indicates the specific resistance of the alloy thin film, the abscissa the concentration (atomic %) of Ti, the solid line the specific resistance of an Al—Ti alloy thin film formed, by sputtering or deposition, on a glass substrate which is kept at a room temperature, and the broken line, the one-dot chain line and the two-dot chain line the specific resistances of Al—Ti alloy thin films after heating of the Al—Ti alloy thin film formed at the room temperature, at temperatures of 250° C., 300° C. and 350° C., respectively. As is evident from FIG. 5, in all the Al—Ti alloy thin films, the higher the concentration of Ti, the higher the specific resistance. Further, the higher the heat treatment temperature, the lower the specific resistance. Thus, it was confirmed from the experiments that the lower the Ti concentration, the lower the specific resistance of the Al—Ti alloy thin film, and that the higher the heat treatment temperature, the lower the specific resistance.

Figure 6:
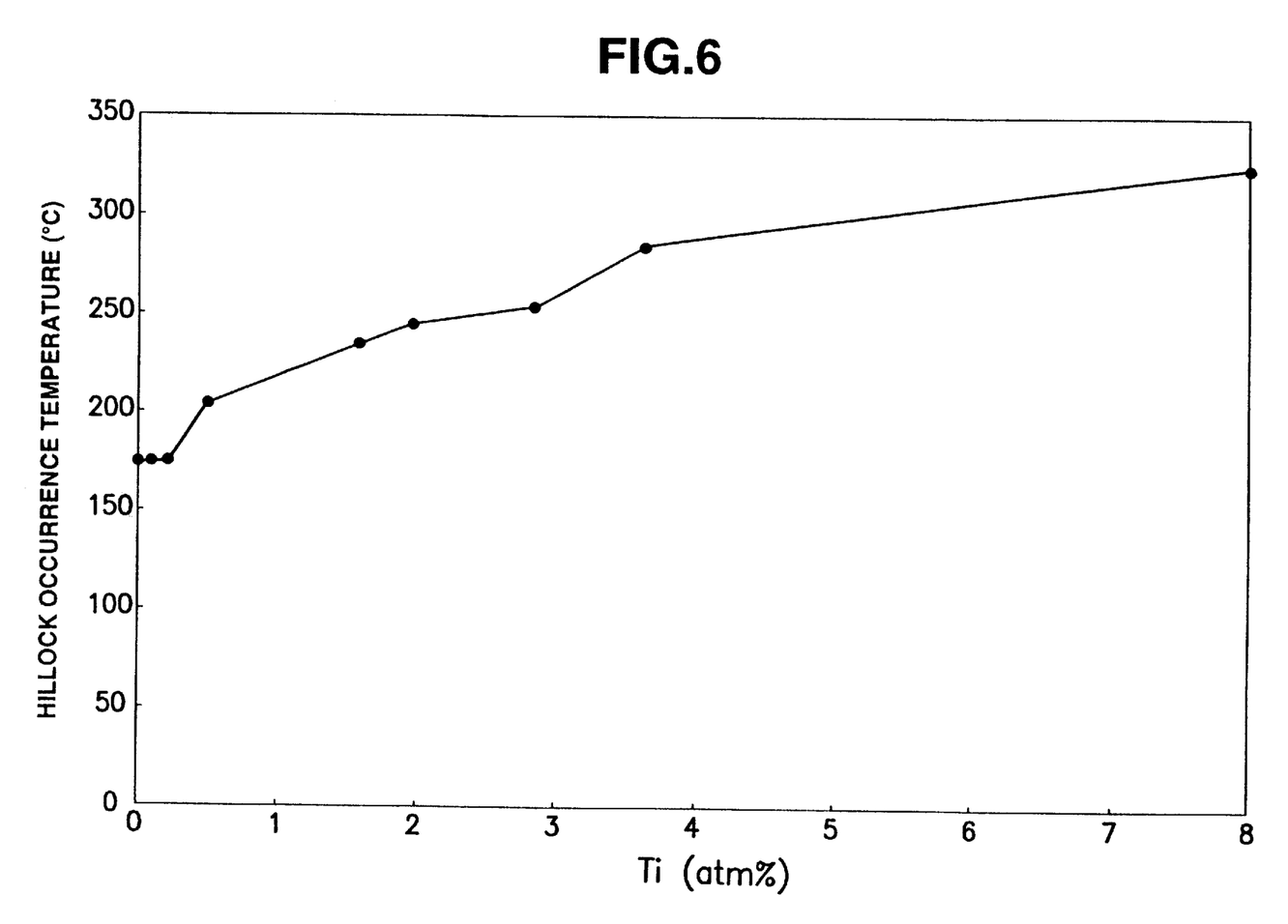
FIG. 6 is a view, showing the anti-hillock characteristic of the Al—Ti alloy thin film.

Moreover, the anti-hillock characteristic of each of the Al—Ti alloy thin films was tested, and test results as shown in FIG. 6 were obtained. In FIG. 6, the ordinate indicates the temperature at which a hillock or hillocks occur. More specifically, the hillock occurrence temperature means a heat treatment temperature at which any hillock with a height of 0.5–1 $\mu$m or more can be observed using an electron microscope with a magnification of about 100 (hereinafter, the hillock occurrence temperature means the same). As is evident from FIG. 6, the occurrence of a hillock can be suppressed if the heat treatment temperature is 250° C. and the Ti concentration is 3 atm % or more. In light of the anti-hillock characteristic, it is desirable to set the Ti concentration at 3 atm % or more through the overall process of forming the wiring substrate, when a heat treatment is performed at about 250° C. at highest in the process. In the case of a heat treatment temperature of 250° C. indicated by the broken line in FIG. 5, however, the specific resistance is about 18 $\mu\Omega$cm or more if the Ti concentration is 3 atm % or more. In other words, when the anti-hillock characteristic is considered, it is not preferable to set the Ti concentration at 3 atm % or less, which means that the specific resistance of the wiring (the scanning line 1 including the gate electrode G) cannot be set at about 18 $\mu\Omega$cm or less. On the other hand, more and more reduction of the resistance of wiring has recently been requested with the development of refining techniques, the increase of the numerical aperture, etc. in the field of liquid crystal display devices. To meet the request, attention has been paid to an Al alloy containing a rare earth metal such as Nd, which has an excellent anti-hillock characteristic and a low specific resistance of about 10 $\mu\Omega$cm or less (see, for example, Jpn. Pat. Appln. KOKAI Publication No. 7-45555).

Figure 7:
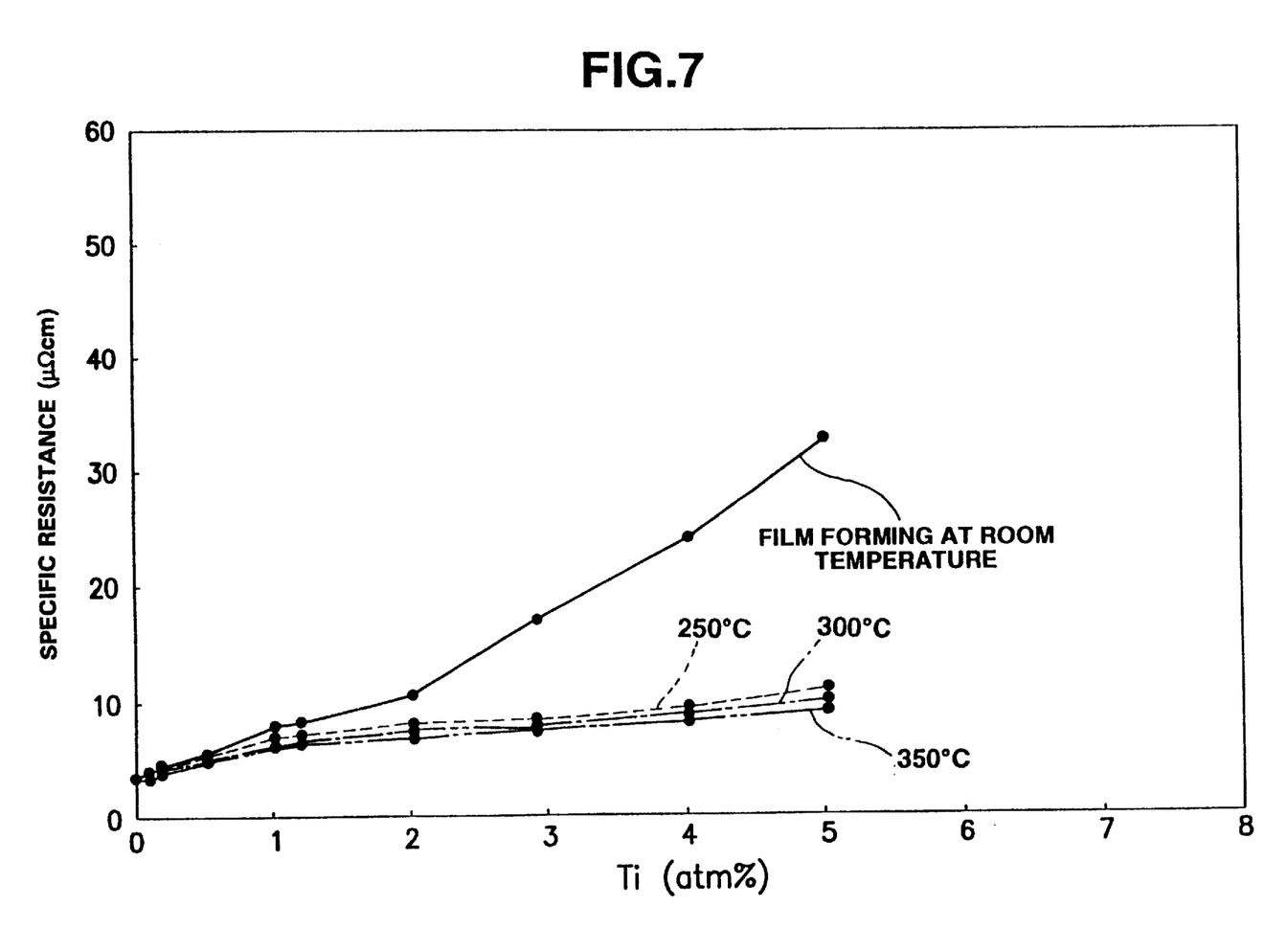
FIG. 7 is a view, showing the dependency of the specific resistance of an Al—Nd alloy thin film upon the concentration of Nd.

However, the inventors of the present invention made experiments using an Al—Nd alloy thin film, and obtained the following results. First, the dependency of the specific resistance of the Al—Nd alloy thin film upon the Nd (Neodymium) concentration was tested, and test results as shown in FIG. 7 were obtained. In FIG. 7, the ordinate indicates the specific resistance of the alloy thin film, and the abscissa the Nd concentration. Further, the solid line indicates the specific resistance, with respect to the Nd concentration, of an Al—Nd alloy thin film formed, by sputtering or deposition, on a glass substrate which is kept at a room temperature, and the broken line, the one-dot chain line and the two-dot chain line the specific resistances of Al—Nd alloy thin films after heating of the Al—Nd alloy thin film formed at the room temperature, at temperatures of 250° C., 300° C. and 350° C., respectively. As is evident from FIG. 7, in all the Al—Nd alloy thin films, the higher the concentration of Nd, the higher the specific resistance. Further, when the Nd concentration is, for example, 2–4 atm %, the specific resistances of all the heated Al—Nd alloy thin films are about 10 μΩcm or less. Thus, it was confirmed that the specific resistances of the Al—Nd alloy thin films can be set at 10 μΩcm or less.

Figure 8:
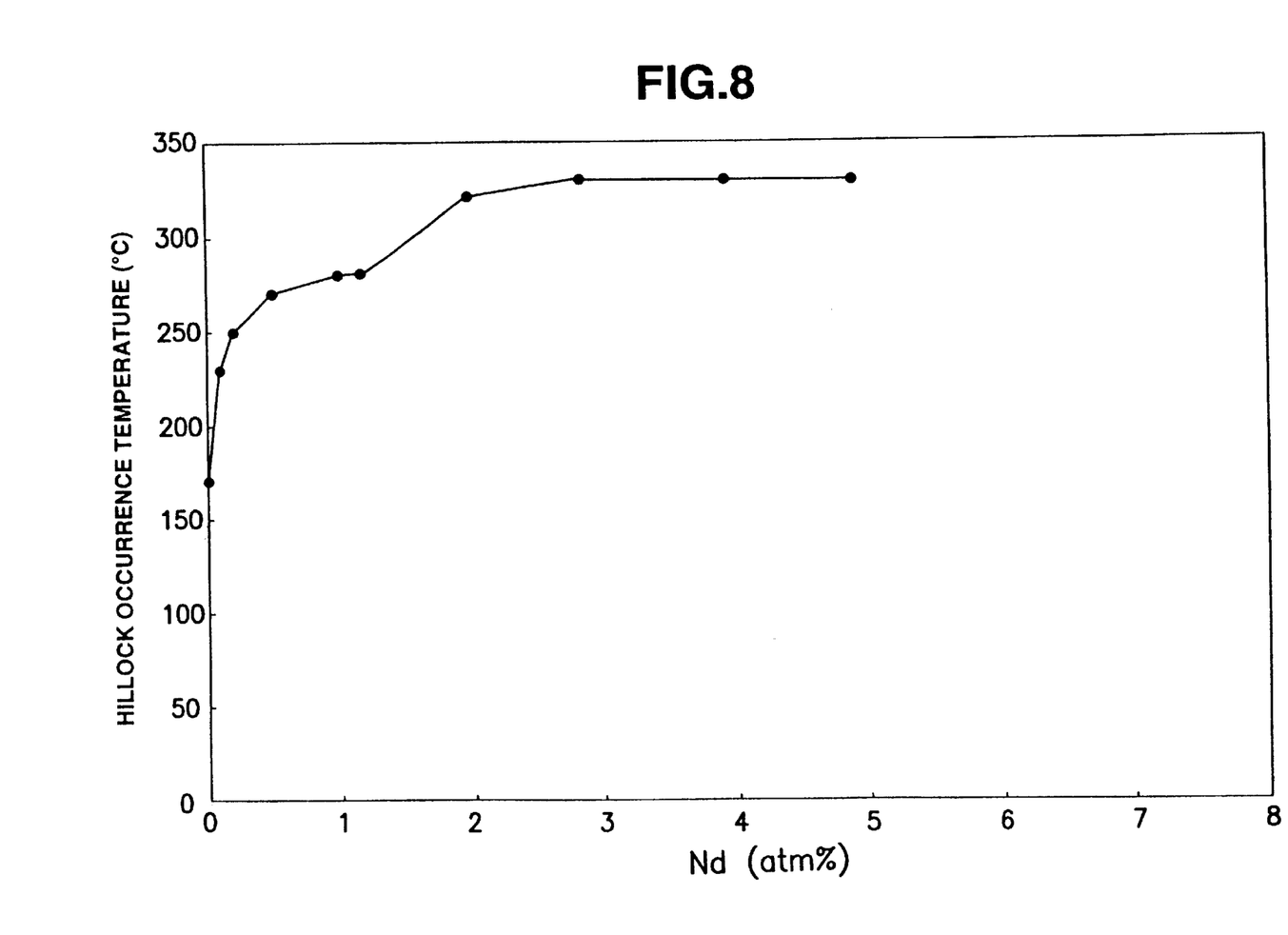
FIG. 8 is a view, showing the anti-hillock characteristic of the Al—Nd alloy thin film.

Moreover, the anti-hillock characteristic of each of the Al—Nd alloy thin film was tested, and test results as shown in FIG. 8 were obtained. In FIG. 8, the abscissa indicates the Nd concentration, and the ordinate the temperature at which a hillock or hillocks occur. As is evident from FIG. 8, the occurrence of a hillock can be suppressed when the heat treatment highest temperature is 250° C., even if the Nd concentration is as low as about 0.2%. It was confirmed that when the Nd concentration is, for example, about 2–4 atm %, the occurrence of a hillock is suppressed, and that the specific resistance is about 10 μΩcm or less, as indicated by the broken line (the heat treatment temperature of 250° C.).

Figure 9:
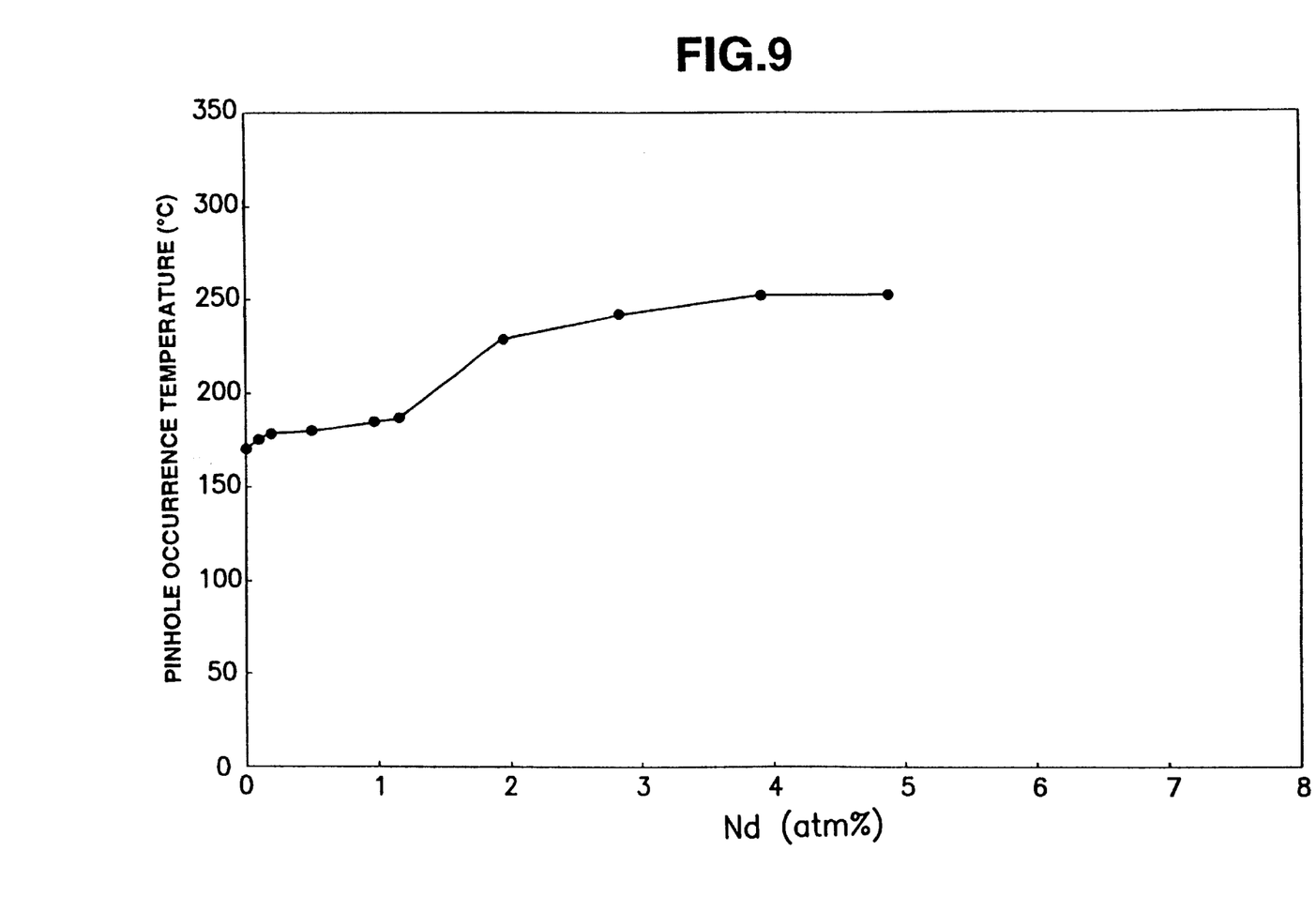
FIG. 9 is a view, showing the anti-pinhole characteristic of the Al—Nd alloy thin film.

Moreover, the anti-pinhole characteristic of each of the Al—Nd alloy thin film was tested, and test results as shown in FIG. 9 were obtained. In FIG. 9, the ordinate indicates the temperature at which a pinhole or pinholes occur. More specifically, the pinhole occurrence temperature means a heat treatment temperature at which more than ten pinholes can be observed per 1 cm$^2$ using an electron microscope with a magnification of about 100 (hereinafter, the pinhole occurrence temperature means the same). As is evident from FIG. 9, the pinhole occurrence temperature is less than 250° C. if the Nd concentration is about 4 atm % or less, and is substantially 250° C. if the Nd concentration is about 4 atm % or more. In light of the anti-pinhole characteristic, it is desirable to set the Nd concentration at about 4 atm % or more when the heat treatment temperature is 250° C. It was found, however, that more and more increase of the Nd concentration will not be so effective to enhance the anti-pinhole characteristic for protecting wiring from breakage, since the pinhole occurrence temperature is substantially kept at about 250° C. when the Nd concentration is about 4 atm % or more. Furthermore, where the Nd concentration is set at 4 atm % or more in consideration of the anti-pinhole characteristic, the specific resistance is about 10 μΩcm or more at the heat treatment temperature of 250° C. indicated by the broken line in FIG. 7.

As described above, in the case of using the Al—Ti alloy thin film as wiring, it is not preferable to set the Ti concentration at 3 atm % or less in light of the anti-hillock characteristic, which makes it impossible to set the specific resistance at about 18 μΩcm or less. On the other hand, in the case of using the Al—Nd alloy thin film as wiring, setting the Nd concentration at 4 atm % or more cannot significantly enhance the anti-pinhole characteristic for protecting the wiring from breakage. In addition, setting the Nd concentration at 4 atm % or more in consideration of the anti-pinhole characteristic makes the specific resistance increase to about 10 μΩcm or more as indicated by the broken line in FIG. 7 (the heat treatment temperature of 250° C.).

The present invention, which has been devised in view of the above problems, provides a wiring substrate comprising a substrate and a conductor formed on the substrate, the conductor formed of an aluminum alloy which contains at least neodymium and titanium.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
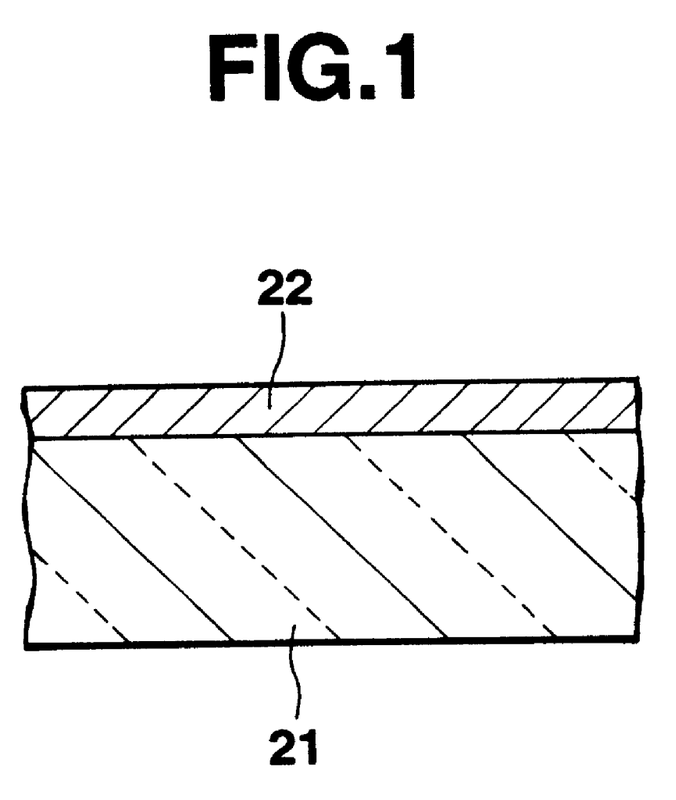
FIG. 1 is an enlarged sectional view, showing a substrate with wiring formed of an Al—Nd—Ti alloy thin film, according to an embodiment of the invention.
Figure 2:
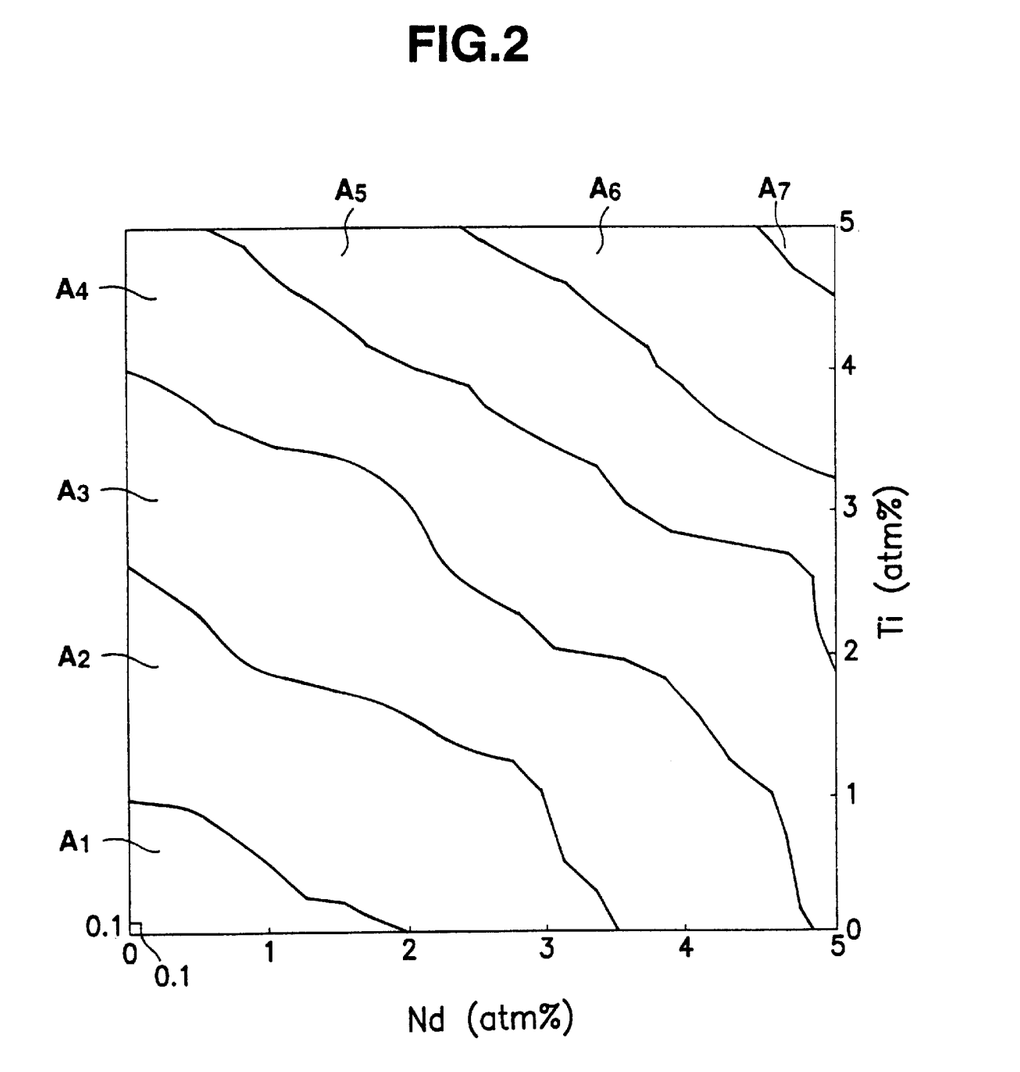
FIG. 2 is a view, showing the dependency of the specific resistance of the Al—Nd—Ti alloy thin film of FIG. 1 upon the concentration of Ti.

FIG. 1 an enlarged sectional view, showing a wiring substrate according to the embodiment of the invention. An Al—Nd—Ti alloy thin film (wiring) 22 was formed on a glass substrate (transparent insulated substrate) 21 by sputtering or deposition. The wiring 22 is used as the scanning line 1 or the data line 2 shown in FIG. 10. First, the dependency, upon the concentrations of Ti and Nd, of the specific resistance of an Al—Nd—Ti alloy thin film formed by setting the substrate temperature at a room temperature was tested, and test results as shown in FIG. 2 were obtained. In the test, the minimum concentrations of Nd and Ti were 0.1 atm %. In FIG. 2, the specific resistance is 10 μΩcm or less in an area $A_1$, 10–20 μΩcm in an area $A_2$, 20–30 μΩcm in an area $A_3$, 30–40 μΩcm in an area $A_4$, 40–50 μΩcm in an area $A_5$, 50–60 μΩcm in an area $A_6$, and 60–70 μΩcm in an area $A_7$. As is evident from FIG. 2, the higher the Nd and Ti concentrations, the higher the specific resistance. Further, FIG. 2 shows that the Nd and Ti concentrations should be selected from the area $A_1$ in order to set, at about 10 $\mu\Omega$cm or less, the specific resistance of the Al—Nd—Ti alloy thin film formed with the substrate temperature kept at a room temperature. Similarly, the Nd and Ti concentrations should be selected from the areas $A_1$ and $A_2$ in order to set the specific resistance at about 20 $\mu\Omega$cm or less.

Figure 3:
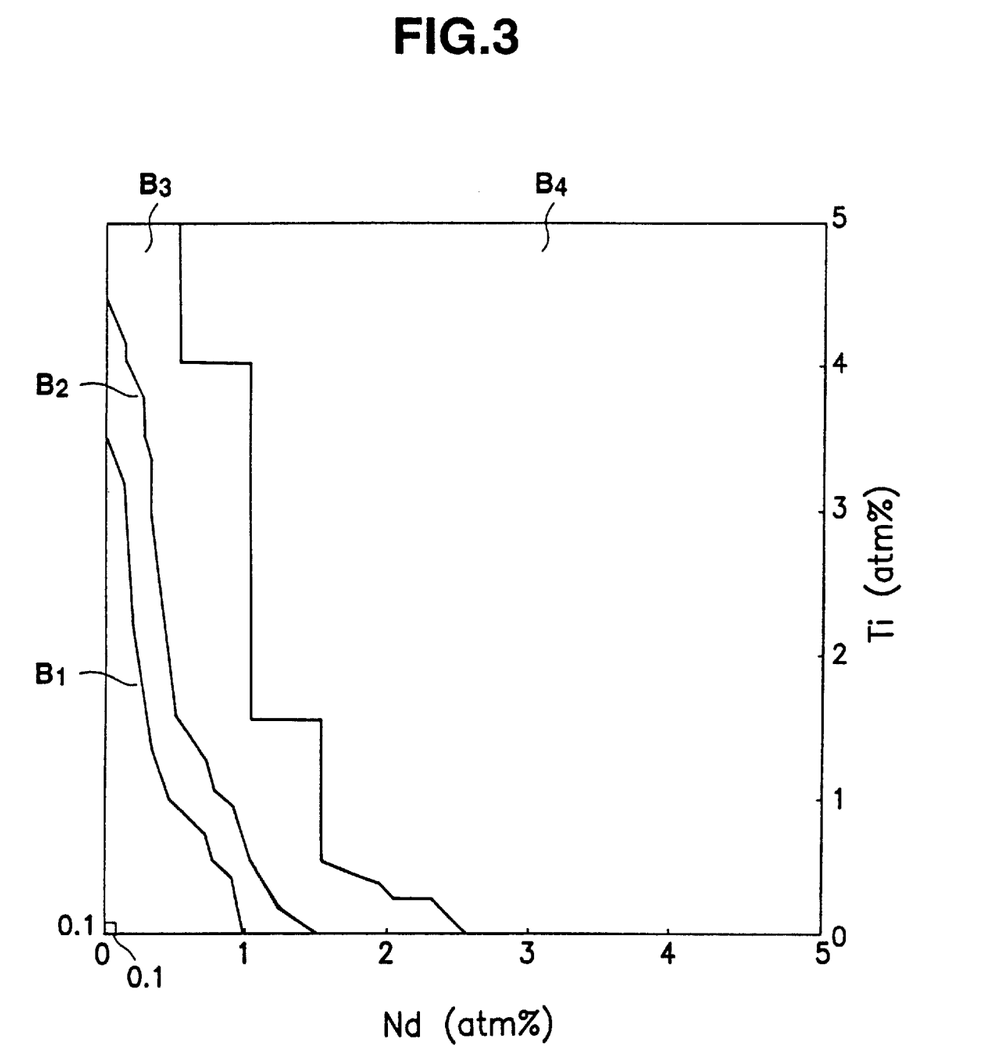
FIG. 3 is a view, showing the dependency of the anti-hillock characteristic of the Al—Nd—Ti alloy thin film of FIG. 1 upon the concentrations of Ti and Nd.

Then, the dependency of the hillock characteristic of the Al—Nd—Ti alloy thin film upon the concentrations of Ti and Nd was tested, and test results as shown in FIG. 3 were obtained. In FIG. 3, the hillock occurrence temperature is 240–270° C. in an area $B_1$, 270–300° C. in an area $B_2$, 300–330° C. in an area $B_3$, and 330–360° C. in an area $B_4$. As is evident from FIG. 3, the occurrence of a hillock is suppressed in the area $B_1$ when the heat treatment temperature is 240–270° C.

Figure 4:
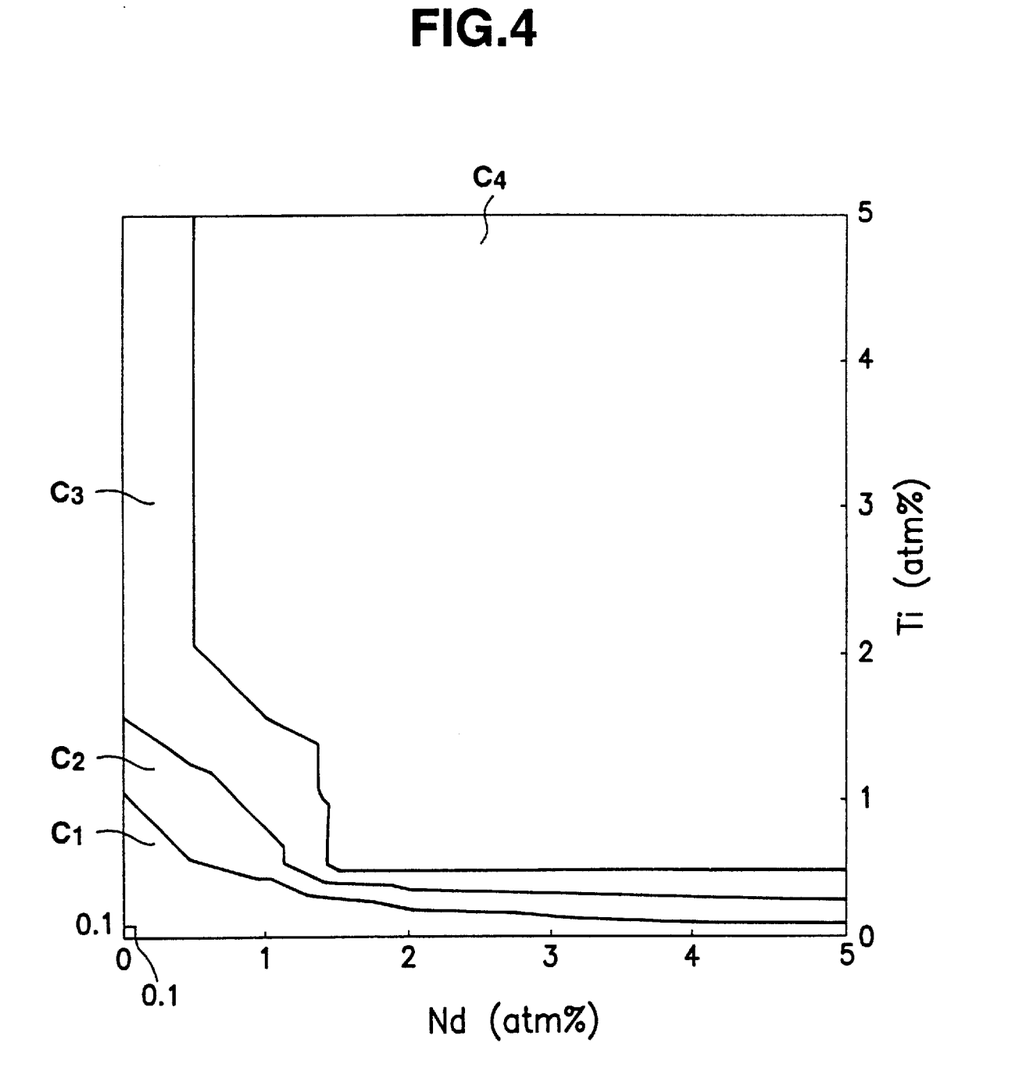
FIG. 4 is a view, showing the dependency of the anti-pinhole characteristic of the Al—Nd—Ti alloy thin film of FIG. 1 upon the concentrations of Ti and Nd.

Further, the dependency of the pinhole characteristic of the Al—Nd—Ti alloy thin film upon the concentrations of Ti and Nd was tested, and test results as shown in FIG. 4 were obtained. In FIG. 4, the pinhole occurrence temperature is 240–270° C. in an area $C_1$, 270–300° C. in an area $C_2$, 300–330° C. in an area $C_3$, and 330–360° C. in an area $C_4$. As is evident from FIG. 4, the occurrence of a pinhole is suppressed in the area $C_1$ when the heat treatment temperature is 240–270° C.

In a case, for example, where the Nd concentration is 0.75 atm % and the Ti concentration is 0.5 atm %, the hillock occurrence temperature is on the boundary between the areas $B_1$ and $B_2$ in FIG. 3, while the pinhole occurrence temperature is on the boundary between the areas $C_1$ and $C_2$ in FIG. 4. Accordingly, the occurrence of any hillock and any pinhole can be suppressed by setting the heat treatment temperature at 240–270° C. Moreover, when the Nd and Ti concentrations are 0.75 atm % and 0.5 atm %, respectively, the specific resistance falls in the area A1 (10 $\mu\Omega$cm or less) in FIG. 2, and the specific resistance of the Al—Nd—Ti alloy thin film formed by setting the substrate temperature at a room temperature can be set at about 8 $\mu\Omega$cm. In addition, it is roughly estimated from FIGS. 5 and 7 that the specific resistance can be made lower than about 8 $\mu\Omega$cm by the heat treatment. In other words, when the heat treatment is performed, the area $A_1$ in which the specific resistance can be kept at 10 $\mu\Omega$cm or less is broadened to the area $A_2$ in FIG. 2. Accordingly, the specific resistance of the Al—Nd—Ti alloy thin film after the heat treatment is set at about 10 $\mu\Omega$cm or less by setting the total of the Nd and Ti concentrations to about 1.5 atm % or less (each of the Nd concentration and the Ti concentration should be set at 0.1 atm % or more). Furthermore, as is evident from FIGS. 3 and 4, the occurrence of a hillock and a pinhole can be substantially suppressed in the case of the total concentration range of about 1.5 atm % or less, when the heat treatment is 240–270° C.

A description will be given of a case where the specific resistance of the Al—Nd—Ti alloy thin film is set at about 18 $\mu\Omega$cm as in the Al—Ti alloy thin film. If the total of the Nd and Ti concentrations to, for example, about 3.5 atm % or less (each of the Nd concentration and the Ti concentration should be set at 0.1 atm % or more), the specific resistance of the Al—Nd—Ti alloy thin film formed by setting the substrate temperature at the room temperature is about 20 $\mu\Omega$cm or less as shown in FIG. 2. In the case of the total concentration range of about 3.5 atm % or less, it is evident from FIGS. 3 and 4 that although a small number of hillocks or pinholes occur when the heat treatment temperature is 240–270° C., their occurrence can be suppressed by increasing the heat treatment temperature. Also in this case, it is roughly estimated from FIGS. 5 and 7 that the specific resistance can be made lower than about 20 $\mu\Omega$cm by the heat treatment. In other words, when the heat treatment is performed, the specific resistance of the Al—Nd—Ti alloy thin film can be set to about 18 $\mu\Omega$cm or less.

The Nd concentration of the Al—Nd—Ti alloy thin film will be considered. In the area $C_1$ in FIG. 4, for example, a pinhole will occur irrespective of the Nd concentration when the heat treatment temperature is 240–270° C. On the other hand, in the area $B_1$ in FIG. 3, a hillock will occur at the heat treatment temperature of 240–270° C., if the Nd concentration is lower than 1 atm %. This means that the Nd concentration may be set at about 1 atm % by considering the occurrence of a hillock and not the occurrence of a pinhole. When the Nd concentration is set at about 1 atm %, it is preferable, in light of the specific resistance, to set the Ti concentration at about 0.1–2 atm %, and more preferable to set it at about 0.1–0.5 atm %.

In the case of the Al—Ti alloy thin film, it is preferable to set the Ti concentration at about 2.9 atm % to realize a lower specific resistance and an excellent anti-hillock characteristic (at the heat treatment temperature of 250° C), as is shown in FIGS. 5 and 6. In the case of the Al—Nd alloy thin film, it is preferable to set the Nd concentration at about 4 atm % to realize a lower specific resistance and an excellent anti-hillock characteristic (at the heat treatment temperature of 250° C.), as is shown in FIGS. 7 and 9. On the other hand, in the case of the Al—Nd—Ti alloy thin film, the total concentration of Nd and Ti can be set at about 1.5 atm % or less. Therefore, when the Al—Nd—Ti alloy thin film is used, the required amounts of expensive Nd and Ti can be reduced as compared with the case of the Al alloy thin film which contains only Ti or Nd. This will lead to reduction of a manufacturing cost.

Although in the above description, the substrate of the invention is applied to a display device, it can also be applied to various devices other than the display device. Further, the wiring is not limited to the scanning line which includes the gate electrode of the thin film transistor, but may be used as a source electrode, a drain electrode or a data line. This case will be briefly explained with reference to FIG. 11. To provide, for example, a data line of an Al—Nd—Ti alloy thin film on a gate insulating film 4 by patterning, an $n^+$-type silicon layer or a chromium layer may be formed on the gate insulating film 4 to prevent a pixel electrode 11 made of ITO from being damaged by an Al etching solution, and then an Al—Nd—Ti alloy thin film may be formed on the resultant structure for forming, for example, a data line. Moreover, the wiring is not limited to the Al—Nd—Ti alloy thin film, but may be formed of an Al alloy thin film which contains one or more rare earth elements and one or more Ti, Ta, Mo, Cr, Au, Ag, Cu.

As described above, according to the invention, to form wiring of, for example, an Al—Nd—Ti alloy thin film enables reduction of its specific resistance to a value equal to or lower than the wiring formed of the Al—Ti alloy thin film, and also enables suppression of the occurrence of a hillock or a pinhole. In this case, it is preferable to set the total concentration of Nd and Ti at from about 3.5 atm % or less to about 0.2 atm % or more (supposing that the Nd concentration is equal to the Ti concentration). Also, it is preferable to set the specific resistance of the Al—Nd—Ti alloy thin film at about 10–1 $\mu\Omega$cm.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A wiring substrate comprising:

a substrate; and a conductor formed on the substrate, wherein the conductor made of an aluminum alloy consists essentially of aluminum, neodymium and titanium and contains at least about 0.1 atm % neodymium and at least about 0.1 atm % titanium with a maximum total amount of titanium and neodymium of 3.5 atm %.

2. A wiring substrate according to claim 1, wherein the concentration of neodymium contained in the aluminum alloy is 2.0 atm % or less.

3. A wiring substrate according to claim 1, wherein the total concentration of neodymium and titanium contained in the aluminum alloy is 1.5 atm % or less.

4. A wiring substrate according to claim 3, wherein the conductor has a specific resistance of 10 $\mu\Omega$ cm or less.

5. A wiring substrate according to claim 3, wherein the concentration of neodymium contained in the aluminum alloy is 1.0 atm % or less.

6. A wiring substrate according to claim 5, wherein the concentration of titanium is more than 0.1 atm %.

7. A wiring substrate comprising:

a substrate; a a semiconductor element formed on the substrate;

a conductor formed on the substrate and electrically connected to the semiconductor element, the conductor made of an aluminum alloy consisting essentially of aluminum, neodymium and titanium and containing at least about 0.1 atm % neodymium and at least about 0.1 atm % titanium with a maximum total amount of titanium and neodymium of 3.5 atm %.

8. A wiring substrate according to claim 7, wherein the concentration of neodymium contained in the aluminum alloy is 2.0 atm % or less.

9. A wiring substrate according to claim 7, wherein the wiring substrate is obtained after a heat treatment of 250° C. or less.

10. A wiring substrate according to claim 7, wherein the total concentration of neodymium and titanium contained in the aluminum alloy is 1.5 atm % or less.

11. A wiring substrate according to claim 10, wherein the concentration of neodymium contained in the aluminum alloy is 1.0 atm % or less.

12. A wiring substrate according to claim 10, wherein the concentration of titanium is more than 0.1 atm %.

13. A method of manufacturing a wiring substrate, comprising the steps of:

preparing a substrate;

forming on the substrate a conductor made of an aluminum alloy consisting essentially of aluminum, neodymium and titanium and containing at least about 0.1 atm % neodymium and at least about 0.1 atm % titanium with a maximum total amount of titanium and neodymium of 3.5 atm %;

forming on the substrate a semiconductor element electrically connected to the conductor; and heating at least one of the conductor and the semiconductor element to 300° C. or less.

14. A method of manufacturing a wiring substrate according to claim 13, wherein the concentration of neodymium is up to 1.0 atm % and the concentration of titanium is more than 0.1 atm %.

15. A method of manufacturing a wiring substrate, comprising the steps of:

preparing a substrate;

forming a semiconductor element on the substrate;

forming on the substrate a conductor made of an aluminum alloy consisting essentially of aluminum, neodymium and titanium and containing at least about 0.1 atm % neodymium and at least about 0.1 atm % titanium with a maximum total amount of titanium and neodymium of 3.5 atm %, such that the conductor is electrically connected to the semiconductor element; and heating at least one of the conductor and the semiconductor element to 300° C. or less.

16. A method of manufacturing a wiring substrate according to claim 18, wherein the concentration of neodymium is up to 1.0 atm % and the concentration of titanium is more than 0.1 atm %.

* * * * *